(12) United States Patent
Iha et al.

(10) Patent No.: US 7,570,307 B2
(45) Date of Patent: Aug. 4, 2009

(54) FILTER DEVICE

(75) Inventors: Yasushi Iha, Tokyo (JP); Takaaki Akiyama, Tokyo (JP)

(73) Assignee: Oki Semiconductor Co., Ltd., Tokyo (JP)

(*) Notice: Subject to any disclaimer, the term of this patent is extended or adjusted under 35 U.S.C. 154(b) by 489 days.

(21) Appl. No.: 11/109,636

(22) Filed: Apr. 20, 2005

(65) Prior Publication Data
US 2006/0062337 A1 Mar. 23, 2006

(30) Foreign Application Priority Data
Sep. 21, 2004 (JP) ............................. 2004-273998

(51) Int. Cl.
*H04N 5/00* (2006.01)

(52) U.S. Cl. ................. 348/624; 375/229; 348/571; 348/607

(58) Field of Classification Search ................ 455/308; 348/534, 571–721, 252; 375/229–230, 323; 382/254, 260–265
See application file for complete search history.

(56) References Cited

U.S. PATENT DOCUMENTS 5,638,134 A 6/1997 Kameyama et al.
6,483,941 B1 * 11/2002 Li ............................... 382/167
6,690,429 B1 * 2/2004 Kim ........................... 348/625
2004/0125113 A1 * 7/2004 Kempf et al. ............... 345/611

FOREIGN PATENT DOCUMENTS

JP 08-079558 3/1996
JP 2002-094358 3/2002

* cited by examiner

*Primary Examiner*—Shuwang Liu
*Assistant Examiner*—James M Perez
(74) *Attorney, Agent, or Firm*—Rabin & Berdo, P.C.

(57) ABSTRACT

A filter device comprises a digital filter, a maximum/minimum detector circuit, and a limiter circuit. The digital filter includes unit delay elements chained together and having M stages (M is an integer equal to or larger than two) for shifting an n-bit (n is a positive integer) digital input signal; n multiplier circuits for multiplying output signals from the unit delay elements at the respective stages by predetermined filter coefficients, respectively; and adder circuits chained together and having (M−1) stages for summing output signals from the respective multiplier circuits to supply a filtered output signal. The maximum/minimum detector circuit detects a maximum value detection signal and a minimum value detection signal in the output signals supplied from the unit delay elements. The limiter circuit limits a minimum value of the filtered output signal based on the maximum value detection signal, and limits a minimum value of the filtered output signal based on the minimum value detection signal.

14 Claims, 12 Drawing Sheets

FIG. 11
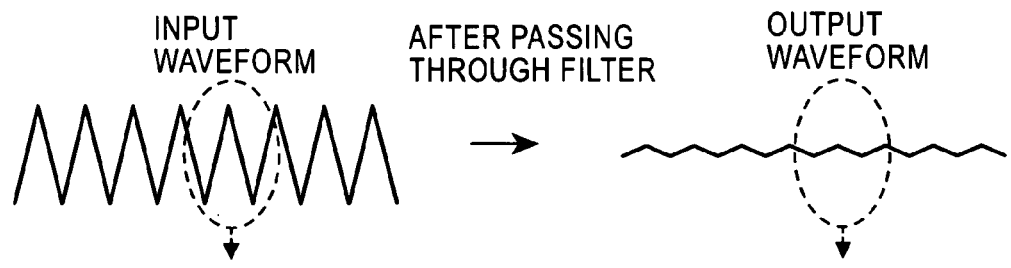
FIG. 11A
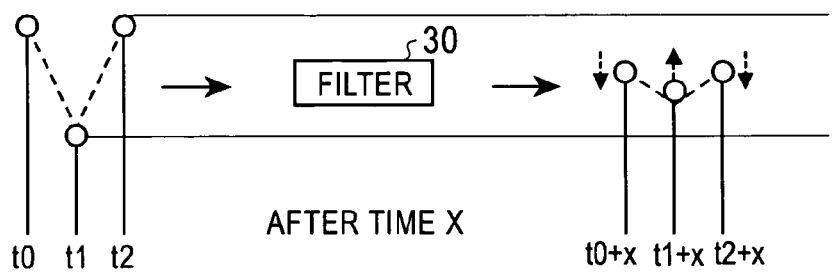
FIG. 11B
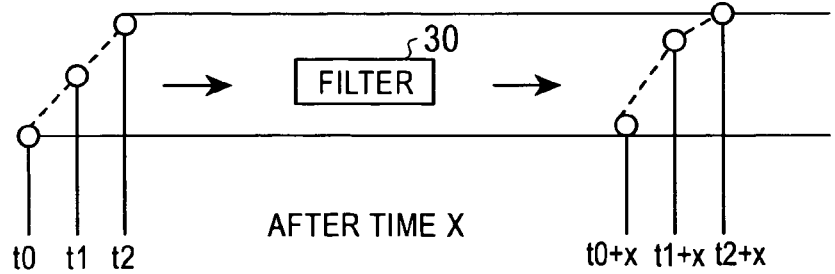
FIG. 11C
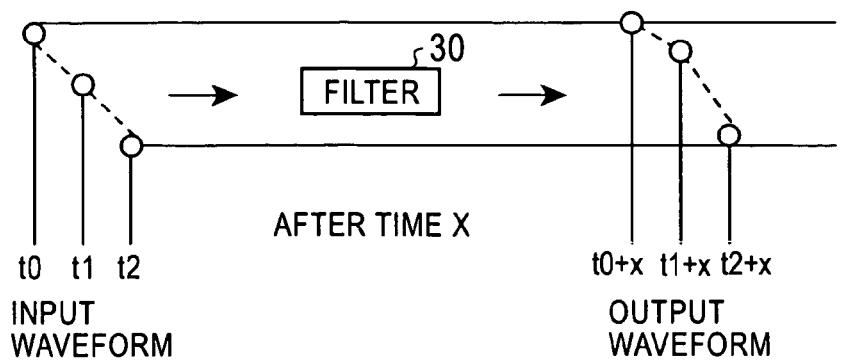
FIG. 11D

FILTER DEVICE

BACKGROUND OF THE INVENTION

1. Field of the Invention

The present invention relates to a filter device capable of generating a filtered output signal free from overshoot and undershoot possibly occurring in an output of a low pass digital filter used for digital image signal processing and the like.

2. Description of the Related Art

Conventionally, there is known a lowpass filter device (for passing low frequency components therethrough) for filtering out high frequency components of a video signal, for example, in digital image signal processing.

FIG. 2 is a schematic diagram of a conventional filter device for use in the digital image signal processing.

This filter device comprises a low pass FIR (Finite Impulse Response) digital filter 10 having a filter length corresponding to, for example, five stages, and a limiter circuit 20 for limiting a maximum value and a minimum value of an output of the digital filter 10.

The FIR digital filter 10 comprises a shift register composed of flip-flops (hereinafter referred to as the "FF") 11-0 to 11-4 chained together and having five stages for shifting an n-bit digital input signal Y[n−1:0] at the respective stages; five multiplier circuits 12-0 to 12-4 for multiplying internal latch data w0[n−1:0] to w4[n−1:0] latched by the FF 11-0 to 11-4 at the respective stages by predetermined filter coefficients A(0) to A(4), respectively; and adder circuits 13-1 to 13-4 chained together and having four stages for summing output signals from the respective multiplier circuits 12-0-12-4 to supply a filtered signal Limit_in[n−1:0].

The filter coefficient A(M) (where M=0, 1, 2, 3, 4) determines the frequency characteristics of the digital filter 10, and is calculated by the following Equation (1):

$$A(M) = (\omega p * T/\pi) * S((n-L) * \omega p * T), \quad (1)$$

where $\omega p * T = 2\pi * (Fp/Fs)$,
$S(x) = \sin(x)/X$,
ωp: Passband Edge Angular Frequency;
Fp: Passband Edge Frequency;
Fs: Sampling Frequency; and
L: Group Delay.

The limiter circuit 20 is a circuit for limiting a maximum and a minimum of the output signal Limit_in[n−1:0] from the digital filter 10 based on a fixed maximum value Max[n−1:0] and a fixed minimum value Min[n−1:0] to supply a signal Limit_out[n−1:0]. In regard to the fixed maximum value Max [n−1:0] and the fixed minimum value Min[n−1:0], for example, in a composite signal, a separate Y (luminance) signal, and a sync-on green signal, the minimum value Min [n−1:0] is often set to −40 IRE which is an "L" level of a horizontal synchronization signal and is referred to as a sync tip level. The maximum value Max[n−1:0] is often set to 100 IRE or higher which is specified by CCIR 601 industrial standard of video. Here, IRE (Institute of Radio Engineers) is a unit representing a relative ratio of a video signal. A video signal portion is defined a range from 0 IRE to 100 IRE.

The filter device of FIG. 2 operates in the following manner.

On receiving a digital input signal Y[n−1:0] as a video signal, FF 11-0 to 11-4 latch and shift the input signal Y[n−1:0] at the respective stages. Internal latch data w0[n−1:0] to w4[n−1:0] supplied from the FF 11-0 to 11-4 at the respective stages are multiplied by filter coefficients A(0) to A(4), respectively, by the respective multiplier circuits 12-0 to 12-4. The results of the multiplications are summed by the adder circuits 13-1 to 13-4, and an output signal Limit_in[n−1:0] from which high frequency components have been removed is supplied from the adder circuit 13-4 at the last stage.

When a maximum value of the output signal Limit_in[n−1:0] is larger than a predefined value or when a minimum value of the output signal Limit_in[n−1:0] is smaller than a predefined value, subsequent circuits will be adversely affected, so that the maximum and minimum values of the output signal Limit_in[n−1:0] are limited by the limiter circuit 20 within a fixed maximum value Max[n−1,0] and a fixed minimum value Min[n−1:0]. Generally, since the fixed maximum value Max[n−1,0] is set larger than the maximum value of the output signal Limit_in[n−1:0], and the fixed minimum value Min[n−1:0] is set smaller than the minimum value of the output signal Limit_in[n−1:0], the output value Limit_in [n−1:0] passes through the limiter circuit 20 as it is, and is supplied as the signal Limit_out[n−1:0].

In the filter device of FIG. 2, the filter length of the filter 10 should be as long as possible, and ideally infinite. However, when the filter 10 is mounted, for example, in a semiconductor integrated circuit, the filter length must be limited due to physical limitations. Equation (1) for calculating the filter coefficients A(M) (M=0, 1, 2, 3, or 4) includes a SIN function, so that the filter coefficient A(M) can be a negative value. The filter 10 which has a short limited filter length and can generate a negative filter coefficient A(M) will cause an increase in the weight of the filter coefficient A(M). This results in, when the waveform of the input signal Y[n−1:0] abruptly rises or falls down from a temporally constant level, overshoot and undershoot occurring in the output signal Limit_out[n−1:0] (=Limit_in[n−1:0]) of the limiter circuit 20.

FIGS. 3 to 5 are diagrams illustrating the cause of the overshoot and undershoot generated in the filter device of FIG. 2, where FIG. 3 is a waveform chart showing the relationship between the output signals of the respective multiplier circuits 12-0 to 12-4 in FIG. 2 and the output signal Limit_out[n−1:0] (=Limit_in[n−1:0]) of the filter 10 when the input signal Y[n−1:0] changes from zero to N (in arbitrary units); FIG. 4 is a waveform chart showing the relationship between the internal latch data w0[n−1:0] to w4[n−1:0] and the output signal Limit_out[n−1:0] (=Limit_in[n−1:0]) of the filter 10; and FIG. 5 is a waveform chart showing the input signal Y[n−1:01] (broken-line curve) and the output signal Limit_out[n−1:0] (=Limit_in[n−1:0]) (solid-line curve) in FIG. 2.

A transfer function H(z) of the filter device in FIG. 2 is expressed by, for example, the following Equation (2):

$$H(z) = -0.0928 * Z(-2) + 0.302 * Z(-1) + \quad (2)$$
$$0.58 * Z(0) + 0.302 * Z(+1) + (-0.092) * Z(+2).$$

In time units T0 to T2 in FIGS. 3 and 4, the input signal Y[n−1:0] has a value of "0" and the output signal Limit_in [n−1:0] of the filter 10 also has a value of "0." In time unit T3, the input signal Y[n−1:0] changes to N. In the time unit T4, the output of the multiplier circuit 12-0 has a value of "−0.019*N." Since the values of the input signals w1[n−1:0] to w4[n−1:0] of the remaining multiplier circuits 12-1 to 12-4 are "0," and the value of the output is "0." Consequently, the output signal Limit_in[n−1:0] has a value of "−0.019*N" which is less than "0" and passes through the limiter circuit 20 as it is, causing undershoot 22 to occur as shown in FIG. 5.

The filter coefficients A(M) are calculated such that they are summed up to be one, so that when only the input signal w4[n−1:0] of the multiplier circuit 12-4 has a value of "0" in time unit T7, the output signal Limit_in[n−1:0] of the filter 10 has a value of "N*1.092" which is larger than N and passes through the limiter circuit 20 as it is, causing overshoot 21 to occur as shown in FIG. 5.

As shown in FIG. 4, the value of the overshoot 21 is larger than the internal latch data w0[n−1:0] to w4[n−1:0], while the value of the undershoot 22 is smaller than the internal latch data w0[n−1:0] to w4[n−1:0]. The same applies when the input signal Y[n−1:0] changes from N to zero.

In a composite signal which is a video signal, the excessive overshoot 21 and undershoot 22 cause a receiver to falsely detect vertical and horizontal synchronization signals, resulting in instable images. Also, a luminance component can be mixed into a color component, giving rise to degraded image quality. In the filter device of FIG. 2, since the maximum value Max[n−1:0] and minimum value Min[n−1:0] used in the limiter circuit 20 are fixed, the filter device cannot eliminate the overshoot 21 or undershoot 22 which have values equal to or larger than the set minimum value Min[n−1:0] or less than the maximum value Max[n−1:0].

Conventionally, for example, Japanese Patent Kokai Nos. 8-79558 and 2002-94358 disclose digital filter devices for removing such overshoot 21 and undershoot 22.

Japanese Patent Kokai No. 8-79558 describes a digital filter device which comprises a first low pass filter (hereinafter referred to as the "LPF") including an FIR digital filter which has a relatively abrupt cut-off characteristics for filtering input digital image data; a second LPF including an FIR digital filter which has a relatively slow cut-off characteristics for filtering the input digital image data; a mixer for mixing the digital image signals filtered by the first and second LFPs, respectively; a step detector for detecting a step-wise change in the value of the input digital image signal; and a controller for controlling a mixing ratio of the digital image signals from the first and second LPFs to be mixed by the mixer on the basis of the step detection output of the step detector. This digital filter device provides a wide flat band and can suppress overshoot.

Japanese Patent Kokai No. 2002-94358 discloses a filter device which comprises a first digital filter for filtering an input signal with an increased number of taps for filter coefficients; a second digital filter for filtering the input signal using a minimally required number of taps to alleviate overshoot and ringing; a high pass filter (hereinafter referred to as the "HPF") for detecting a portion of the input signal in which a change is found; a boundary signal generator for generating a boundary signal which changes at a constant slope within a range of a boundary between an effective portion of the input signal and a blanking period based on a synchronization signal; a synthesis signal generator for receiving the signals from the HPF and boundary signal generator to output a determination signal; and a synthesizer for receiving the signals from the first and second digital filters to predominantly output the signal from the second digital filter in a portion of the input signal in which no change is found and in a boundary portion between the effective portion of the input signal and the blanking period, and to predominantly output the signal from the digital filter in the remaining portion based on the determination signal. This filter device can suppress the overshoot which can occur during filtering.

However, there are the following problems (a) to (c) to be solved associated with the conventional filter devices:

(a) The filter device of Japanese Patent Kokai No. 8-79558 includes the first and second LPFs for providing a single filtering effect and the mixer for controlling the mixing ratio, resulting in an increased chip area, and cannot completely eliminate the overshoot because the filter device basically involves a switch between the first and second LPFs.

(b) The filter device of Japanese Patent Kokai No. 2002-94358 includes the HPF, and replaces a boundary plane with another signal by the boundary signal generator, synthesis signal generator, and synthesizer to control the mixing ratio, resulting in an increased chip area. Moreover, while a filter is employed for removing a sub-carrier frequency component from a luminance signal, this filter is not necessary and rather adversely affects.

(c) Assuming that Japanese Patent Kokai No. 8-79558 and Japanese Patent Kokai No. 2002-94358 are applied for removing the overshoot 21 and undershoot 22 generated in the filter device of FIG. 2, measures must be taken, such as increasing the number of the filters 10, resulting in not only an increased chip area but also difficulties in removing the overshoot 21 and undershoot 22 without making the circuit configuration complicated.

SUMMARY OF THE INVENTION

It is an object of the present invention to provide a filter device which is capable of solving the problems associated with the prior art, and precisely suppressing overshoot and undershoot in a relatively simple circuit configuration while limiting an increase in the chip area.

According to one aspect of the present invention, there is provided a filter device comprising a digital filter, a maximum/minimum detector circuit, and a limiter circuit.

The digital filter includes unit delay elements chained together and having M stages (where M is a positive integer equal to or larger than two) for shifting an n-bit (where n is a positive integer) digital input signal supplied thereto at the respective stages; M multiplier circuits connected to the outputs of the unit delay elements at the respective stages, each for multiplying an output signal of the unit delay element at a stage associated therewith by a predetermined filter coefficient; and adder circuits chained together and having (M−1) stages and connected to the outputs of the M multiplier circuits for summing output signals of the respective multiplier circuits to supply a filtered output signal.

The maximum/minimum detector circuit is a circuit for detecting a maximum value and a minimum value in output signals from the unit delay elements having M stages to supply a maximum value detection signal and a minimum value detection signal. Further, the limiter circuit receives the filtered output signal supplied from the adder circuit at the (M−1)-th stage, limiting a maximum value of the filtered output signal based on the maximum value detection signal, limiting a minimum value of the filtered output signal based on the minimum value detection signal, and supplying the limited signal.

According to one aspect of the present invention, since the maximum value and minimum value to be used in the limiter circuit are detected in the output signals from the unit delay elements of the filter, overshoot and undershoot can be completely eliminated.

According to another aspect of the present invention, there is a filter device comprising a digital filter, a maximum/minimum detector circuit, and a limiter circuit.

The digital filter includes unit delay elements chained together having (M+1) stages (where M is a positive integer equal to or larger than two) for shifting an (n+1)-bit (where n is a positive integer) digital input signal supplied thereto at the respective stages; (M+1) multiplier circuits connected to the outputs of the unit delay elements at the respective stages, each for multiplying an output signal of the unit delay element at a stage associated there with by a predetermined filter coefficient; and adder circuits chained together M stages and connected to the outputs of the (M+1) multiplier circuits for summing output signals or the respective multiplier circuits to supply a filtered output signal.

The maximum/minimum detector circuit is a circuit for detecting a maximum value and a minimum value in a first output signal of the unit delay element at an $\{[(M-1)/2]-1\}$ stage, a second output signal at an $[(M-1)/2]$ stage, and a third output signal at an $\{([(M-1)/2]+1\}$ stage to supply a maximum value detection signal and a minimum value detection signal. Further, the limiter circuit receives the filtered output signal supplied from the adder circuit at the M-th stage, limiting a maximum value of the filtered output signal based on the maximum value detection signal, limiting a minimum value of the filtered output signal based on the minimum value detection signal, and supplying the limited signal.

According to another aspect of the present invention, since output signals supplied to the maximum/minimum detector circuit from the unit delay elements may be sufficiently taken at three points, irrespective of the number of taps, overshoot and undershoot can be completely eliminated without requiring the complicated circuit configurations of the maximum/minimum detector circuit and the limiter circuit.

BRIEF DESCRIPTION OF THE DRAWINGS

FIGS. 11 to 11D are waveform charts of inputs and outputs of the FIR digital filter 30 in FIG. 10.

DETAILED DESCRIPTION OF THE INVENTION

A filter device according to the present invention comprises a digital filter, a maximum/minimum detector circuit, and a limiter circuit.

The digital filter includes unit delay elements (for example, FF) chained together and having (M+1) stages (where M is a positive integer equal to or more than two) and operable in response to an incoming (n+1) bit (where n is a positive integer) digital input signal, for shifting the digital input signal at the respective stages; (M+1) multipliers respectively connected to outputs of the unit delay elements at the respective stages for multiplying output signals of the unit delay elements at the respective stages by predetermined filter coefficients, respectively; and adder circuit chained together and having M stages and connected to the outputs of the (M+1) multiplier circuits for summing output signals of the respective multiplier circuits to supply a filtered output signal.

In overshoot and undershoot which can occur in the digital filter, the value of the overshoot is larger than the values of the output signals in the unit delay elements at the (M+1) stages, while the value of the undershoot is smaller than the values of the output signals in the unit delay elements at the (M+1) stages. Taking advantage of this feature, in the present invention, the maximum/minimum detector circuit detects a maximum value and a minimum value from a first output signal of the unit delay element at an $\{[M-1)/2]-1\}$ stage, a second output signal of the unit delay element at an $[(M-1)/2]$ stage, and a third output signal of the unit delay element at an $\{[M-1)/2]+1\}$ stage, and supplies a maximum value detection signal and a minimum value detection signal to the limiter circuit. The limiter circuit receives the filtered output signal supplied from the adder circuit at the n-th stage, limits the maximum value of the filtered output signal based on the maximum value detection signal, while limits the minimum value of the filtered output signal based on the minimum value detection signal, and supplies the resulting filtered output signal.

The maximum/minimum detector circuit comprises, for example, a first comparing means for comparing the first, second, and third output signals in magnitude; a first selecting means for selecting and supplying the largest one of the first, second, and third output signals based on the result of the comparison made by the first comparing means; a second comparing means for comparing the first, second, and third output signals in magnitude; and a second selecting means for selecting and supplying the smallest one of the first, second, and third output signals based on the result of the comparison made by the second comparing means.

Configuration

Figure 1:
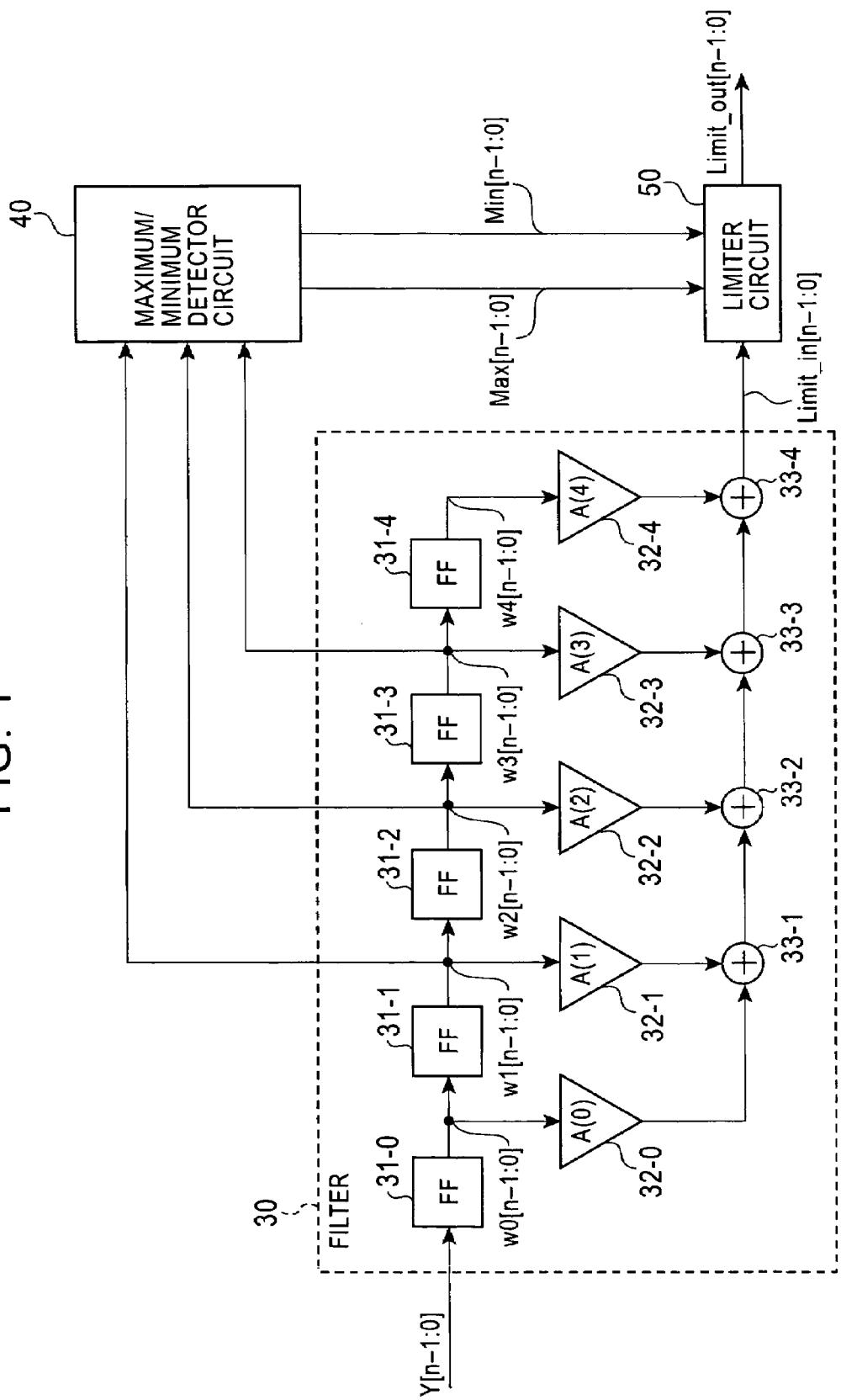
FIG. 1 is a schematic diagram of a filter device which is a first embodiment of the present invention.
Figure 2:
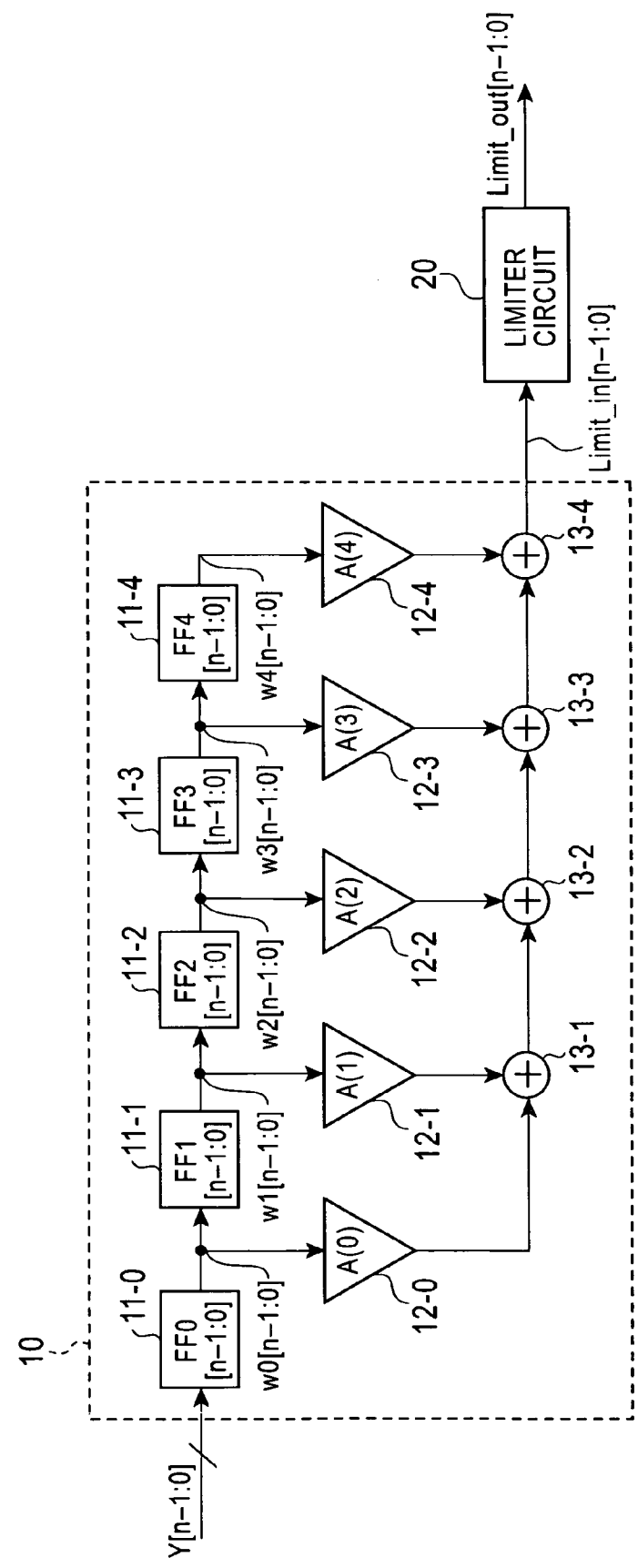
FIG. 2 illustrates a schematic diagram of a conventional filter device.
Figure 3:
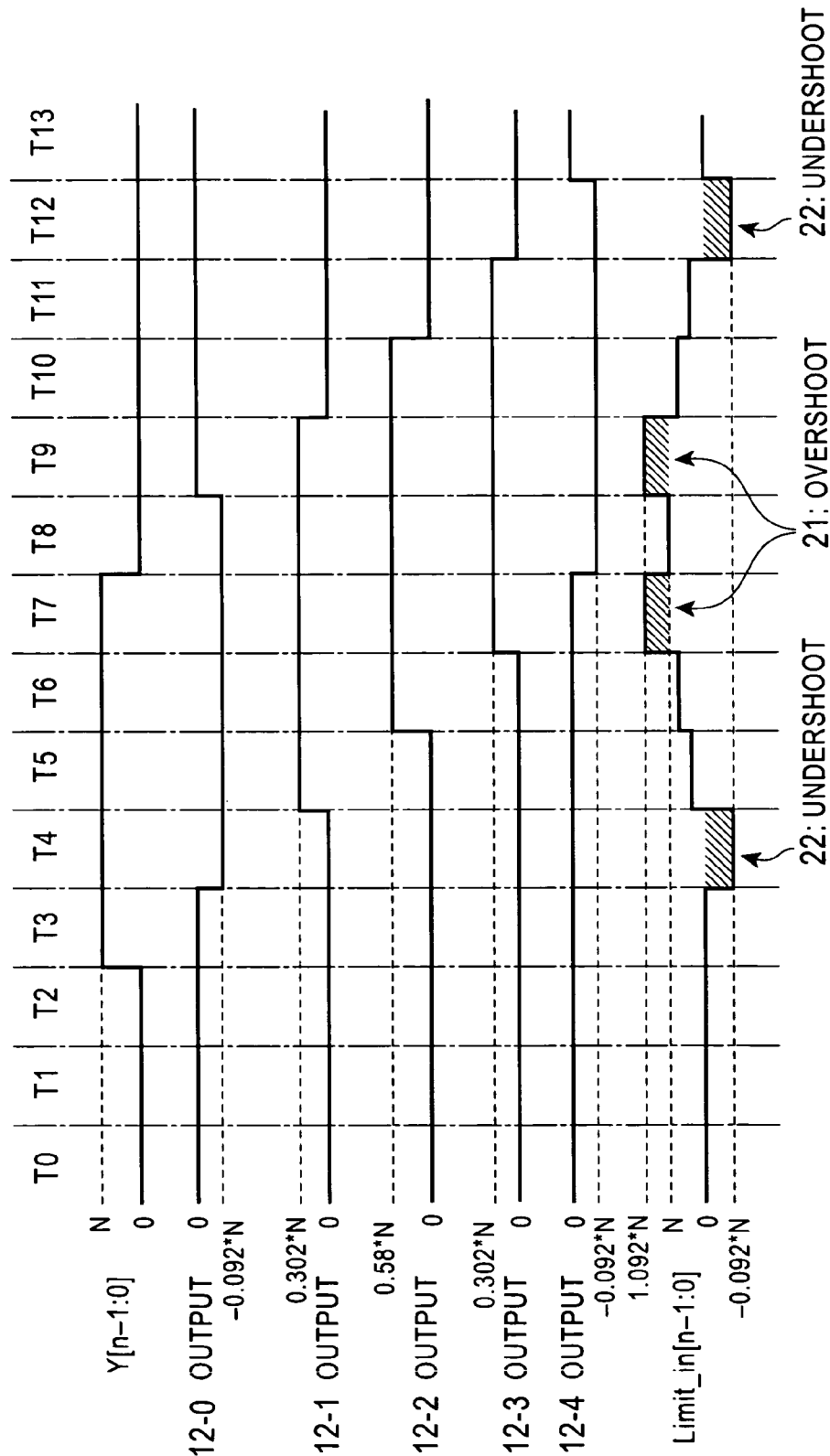
FIG. 3 is a waveform chart illustrating the relationship between output signals of respective multiplier circuits 12-0 to 12-4 and an output signal of a filter 10 in FIG. 2.
Figure 4:
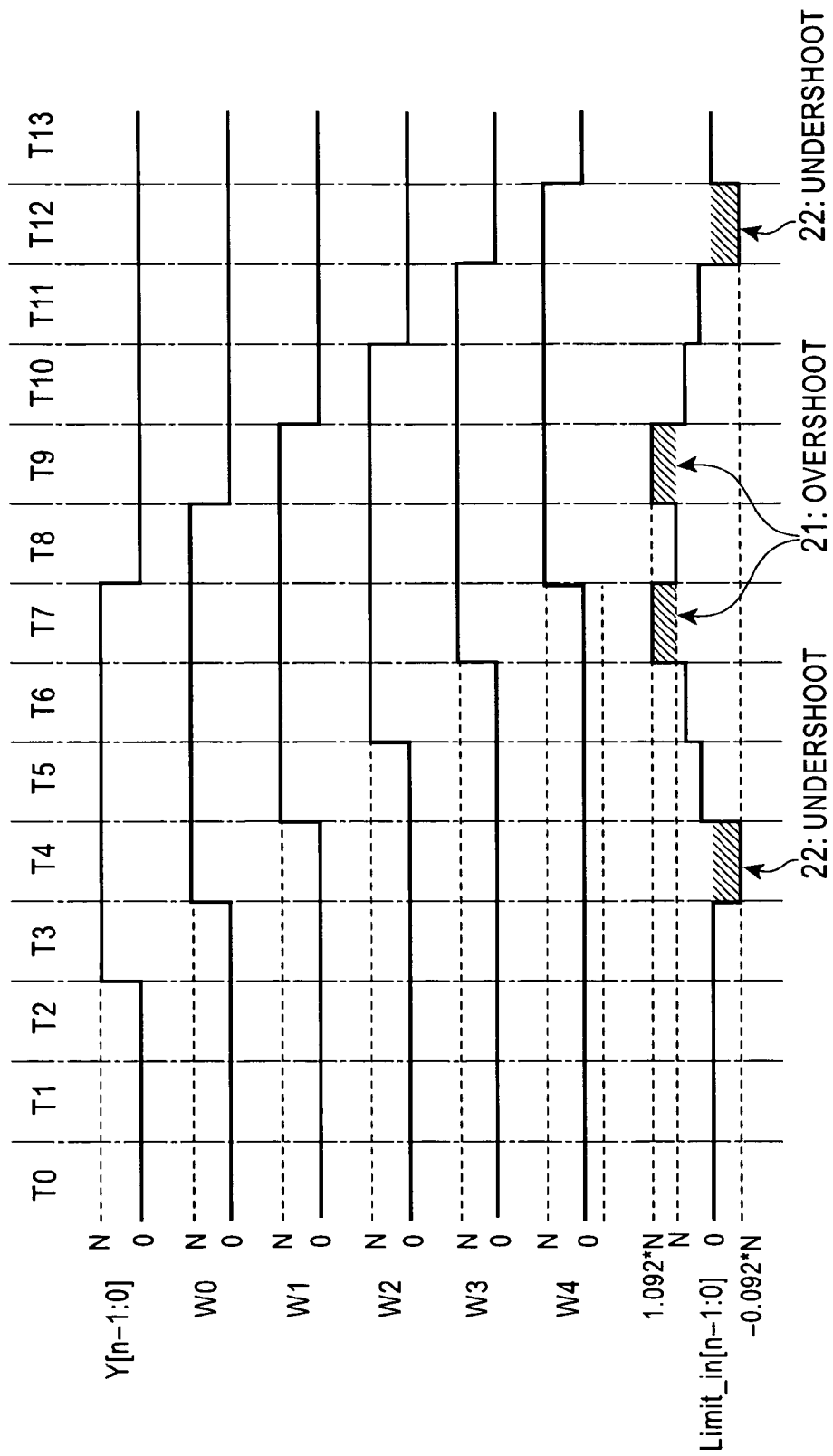
FIG. 4 is a waveform chart illustrating the relationship between internal latch data and the output signal of the filter 10 in FIG. 2.
Figure 5:
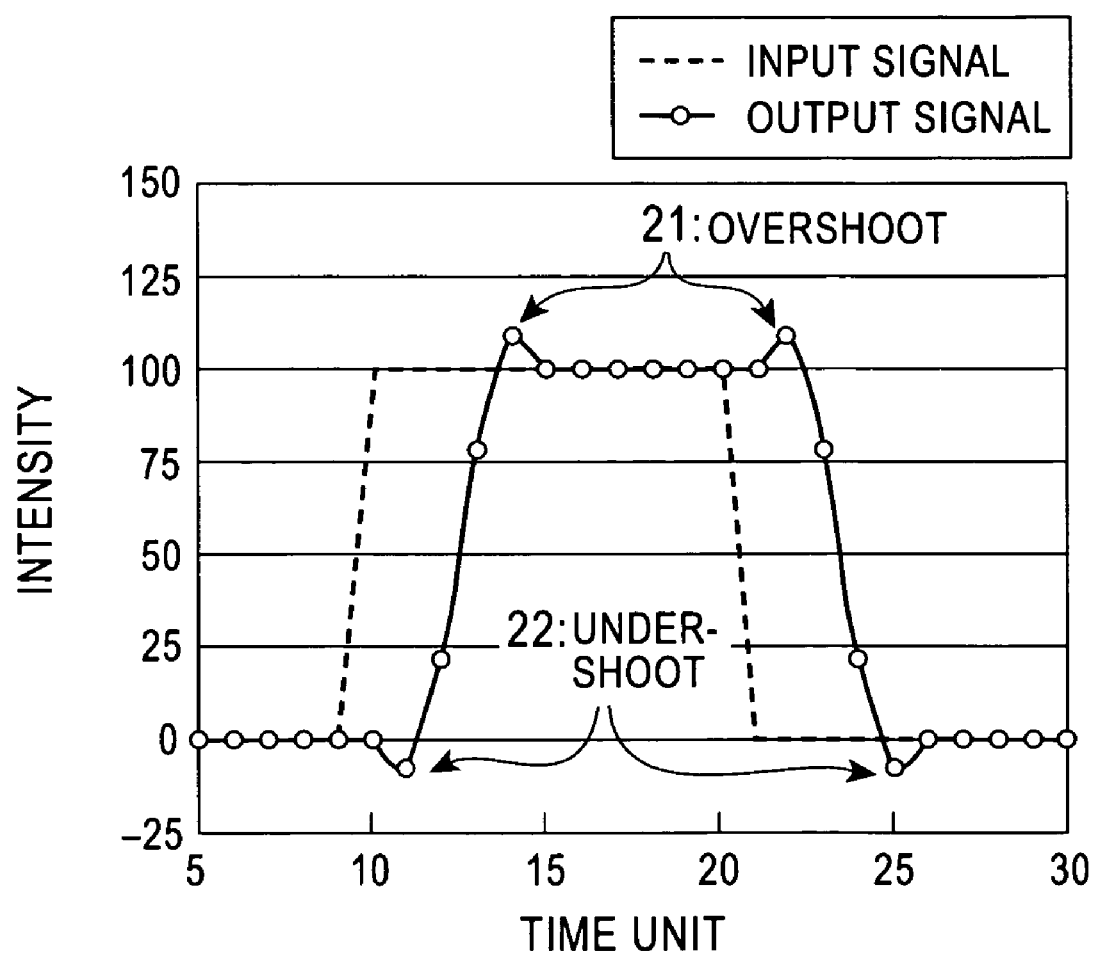
FIG. 5 is a waveform chart illustrating an input signal and an output signal in FIG. 2.

FIG. 1 is a schematic diagram of the filter device showing a first embodiment of the present invention. This filter device is a device for use in digital image signal processing and the like, and comprises a low pass FIR digital filter 30 having a filter length of M stages (for example, five stages with n=0, 1, 2, 3, 4); a maximum/minimum detector circuit 40 for detecting a maximum value Max[n−1:0] and a minimum value Min[n−1:0] of internal latch data (for example, three data w1[n−1:0], w2[n−1:0], and w3[n−1:0] of the FIR digital filter 30; and a limiter circuit 50 for limiting the maximum and minimum of the output signal Limit_in[n−1:0] of the FIR digital filter 30 based on the detected maximum value Max[n−1:0] and minimum value Min[n−1:0] to supply an output signal Limit_out[n−1:0].

The FIR digital filter 30 comprises a shift register composed of unit delay elements (for example, FFs) 31-0 to 31-4 chained together and having five stages for shifting an n-bit digital input signal Y[n−1:0] at the respective stages; five multiplier circuits 32-0 to 32-4 for multiplying internal latch data w0[n−1:0] to w4[n−1:0] latched by the FFs 31-0 to 31-4 at the respective stages by predetermined filter coefficients A(0) to A(4), respectively; and adder circuits 33-1 to 33-4 chained together and having four stages for summing output signals of the respective multiplier circuits 32-0 to 32-4 to supply the filtered output signal Limit_in[n−1:0]. The filter coefficients A(M) (where M=0, 1, 2, 3, 4) determine the frequency characteristics of the digital filter 30 as before, and are calculated by the aforementioned Equation (1).

Figure 6:
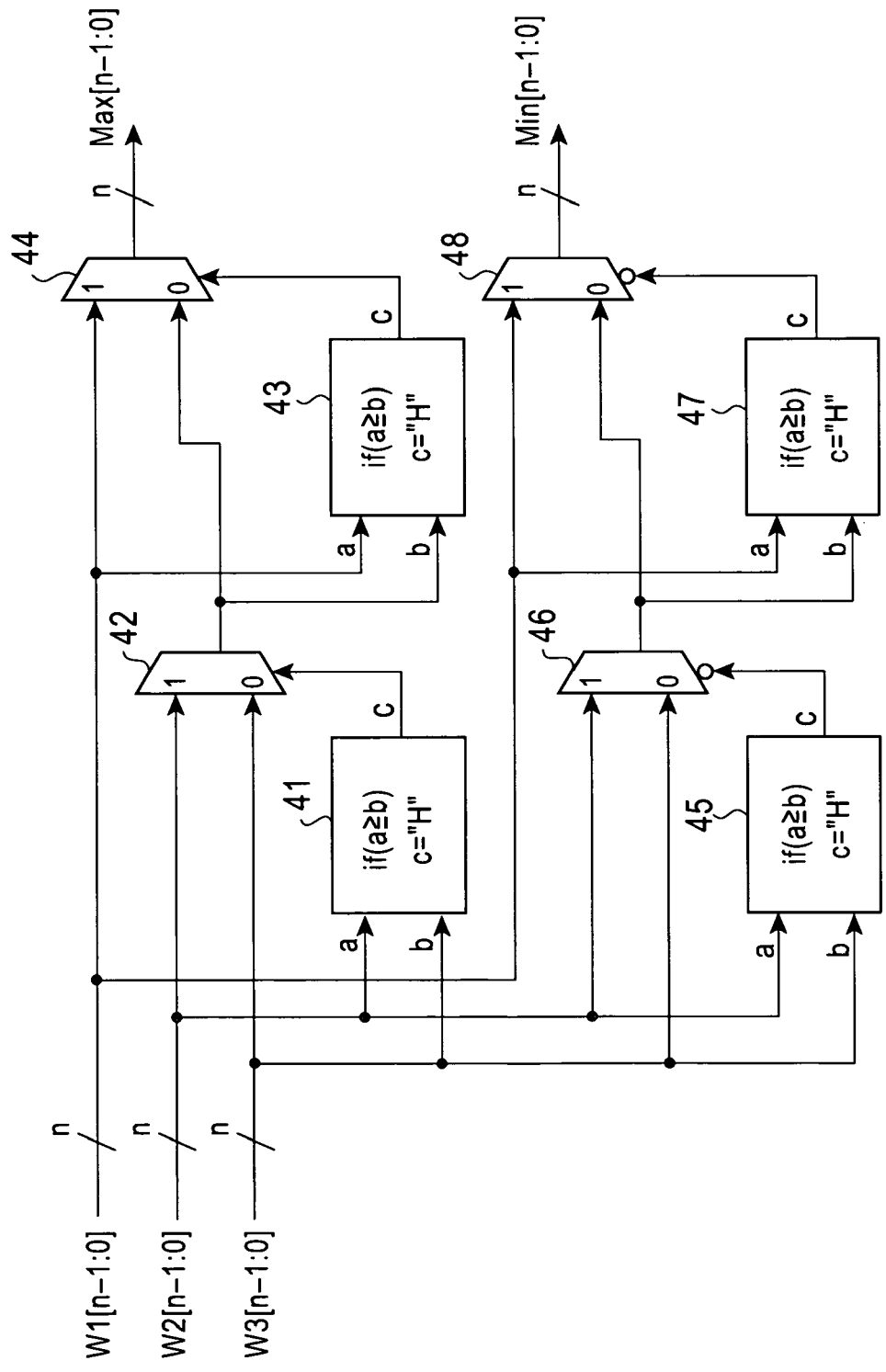
FIG. 6 is a schematic diagram illustrating a maximum/minimum detector circuit 40 in FIG. 1.

FIG. 6 is a schematic diagram illustrating the maximum/minimum detector circuit 40 in FIG. 1.

This maximum/minimum detector circuit 40 comprises a maximum detector circuit for detecting a maximum value Max[n−1:0] of three internal latch data w1[n−1:0], w2[n−1:0], and w3[n−1:0]input thereto; and a minimum detector circuit for detecting a minimum value Min [n−1:0] of the three internal latch data w1[n−1:0], w2[n−1:0], and w3[n−1:0] input thereto.

The maximum detector circuit comprises a comparator 41 for comparing in magnitude two internal latch data w2[n−1:0], w3[n−1:0] of the three internal latch data w1[n−1:0], w2[n−1:0], and w3[n−1:0] input thereto; a selector 42 for selecting the larger one of the two internal latch data w2[n−1:0] and w3[n−1:0] based on the result of the comparison made by the comparator 41; a comparator 43 for comparing in magnitude the internal latch data w1[n−1:0] with the result of the selection made by the selector 42; and a selector 44 for selecting the larger one of the internal latch data w1[n−1:0] and the result of the selection made by the selector 44 based on the result of the comparison made by the comparator 43 to supply the maximum value Max[n−1:0]. Here, the comparators 41, 43 comprise the first comparing means, and the selectors 42, 44 comprise the first selecting means.

For example, the comparator 41 has two input terminals a, b for receiving two internal latch data w2[n−1:0], w3[n−1:0], and an output terminal c for supplying the result of a comparison, wherein a signal at the output terminal c goes to "H" level when data at the input terminal a is equal to or larger than data at the input terminal b, and to "L" level when the data at the input terminal a is smaller than the data at the input terminal b. The selector 42 selects and outputs the data w2[n−1:0] on the "1" side when the signal at the output terminal c is at "H" level, and selects and supplies the data w3[n−1:0] on the "0" side when the signal at the output terminal c is "L" level. The comparator 43 has two input terminals a, b for receiving the internal latch data w1[n−1:0] and the result of a selection made by the selector 42, respectively, and an output terminal c for supplying the result of the comparison, where c="H" when a=b, and c="L" when a<b. The selector 44 selects and outputs the data w1[n−1:0] on the "1" side when the signal at the output terminal c is at "H" level, and selects and outputs the output data of the selector 42 on the "0" side when the signal at the output terminal c is at "L" level.

The minimum detector circuit comprises a comparator 45 for comparing in magnitude two internal latch data w2[n−1:0], w3[n−1:0] of three internal latch data w1[n−1:0], w2[n−1:0], w3[n−1:0] input thereto; a selector 46 for selecting the smaller one of the two internal latch data w2[n−1:0], w3[n−1:0] based on the result of the comparison made by the comparator 45; a comparator 46 for comparing in magnitude the internal latch data w1[n−1:0] with the result of the selection made by the selector 46; and a selector for selecting the smaller one of the internal latch data w1[n−1:0] and the result of the selection made by the selector 46 based on the result of the comparison made by the comparator 47 to supply the minimum value Min[n−1:0]. Here, the comparators 45, 47 comprise the second comparing means, and the selectors 46, 48 comprise the second selecting means.

For example, the comparator 45 has two input terminals a, b for receiving two internal latch data w2[n−1:0], w3[n−1:0], and an output terminal c for outputting the result of the comparison, where c="H" when a=b, and c="L" when a<b. The selector 46 selects and supplies the data w3[n−1:0] at the "0" side when c="H" which is inverted, and selects and supplies the data w2[n−1:0] on the "1" side when c="H" which is inverted. The comparator 47 has two input terminals a, b for receiving the internal latch data w1[n−1:0] and the result of a selection made by the selector 46, and an output terminal c for outputting the result of the comparison, where c="H" when a=b, and c="L" when a<b. The selector 48 selects and supplies the result of the selection made by the selector on the "0" side when c="H" which is inverted, and selects and supplies the internal latch data w1[n−1:0] on the "1" side when c="L" which is inverted.

Figure 7:
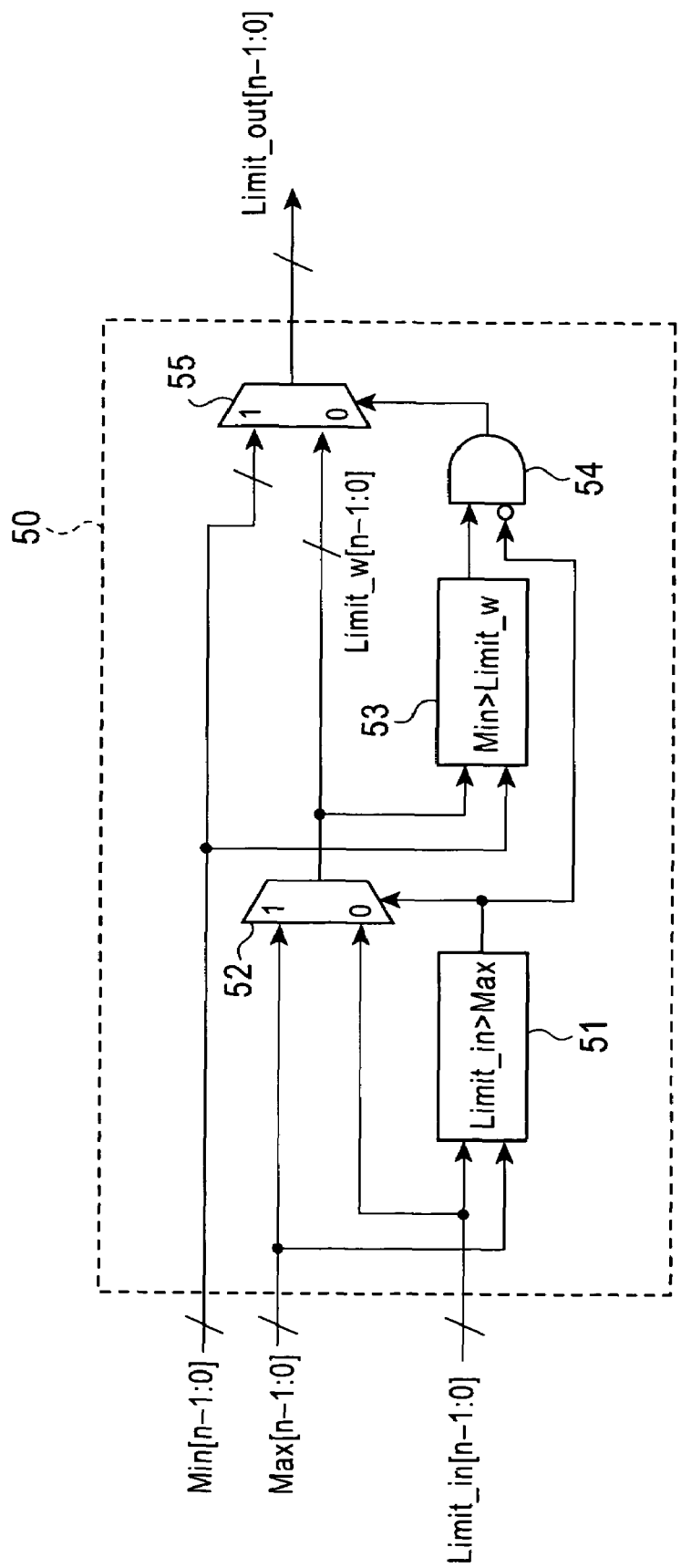
FIG. 7 is a schematic diagram illustrating a limiter circuit 50 in FIG. 1.

FIG. 7 is a schematic diagram showing the limiter circuit 50 in FIG. 1.

The limiter circuit 50 comprises a comparator 51 for comparing in magnitude the filtered output signal Limit_in[n−1:0] with the maximum value Max[n−1:0], and outputs a comparison result at "H" level when Limit_in[n−1:0]>Max[n−1:0], and outputs a comparison result at "L" level when Limit_in[n−1:0]=Max[n−1:0]; and a selector 52 for selecting the maximum value Max[n−1:0] on the "1" side when the comparison result of the comparator 51 is at "H" level, and selects and outputs the filtered output signal Limit_in[n−1:0] on the "0" side when the comparison result of the comparator 51 is at "L" level. A comparator 53 and a selector 55 are connected to the output side of the selector 52, while an AND gate 54 is connected to the output sides of the comparators 51, 53.

The comparator 53 compares in magnitude the selection result Limit_w[n−1:0] of the selector 52 with the minimum value Min[n−1:0], and outputs a comparison result at "H" level when Min[n−1:0]>Limit_w[n−1:0], and outputs a comparison result at "L" level when Min[n−1:0]=Limit_w[n−1:0]. The AND gate 54 takes a logical AND of the comparison result of the comparator 53 and an inverted version of the comparison result of the comparator 51. The selector 55 selects the minimum value Min[n−1:0] on the "1" side when an output signal of the AND gate 54 is at "H" level, and selects the selection result Limit_w[n−1:0] on the "0" side when the output signal of the AND gate 54 is at "L" level to output the signal Limit_out[n−1:0].

General Operation in FIG. 1

For example, as the filter 30 receives a digital input signal Y[n−1:0] which is a video signal, the input signal Y[n−1:0] is latched by the FFs 31-0 to 31-4 at the respective stages, and shifted at the respective stages. Internal latch data w0[n−1:0] to w4[n−1:0] supplied from the FFs 31-0 to 31-4 at the respective stages are multiplied by filter coefficients A(0) to A(4), respectively, by the associated multiplier circuits 32-0 to 32-4. These multiplication results are summed by the adder circuits 33-1 to 33-4, and an output signal Limit_in[n−1:0], from which high frequency components have been removed, is output from the adder circuit 33-4 at the final stage.

Figure 8:
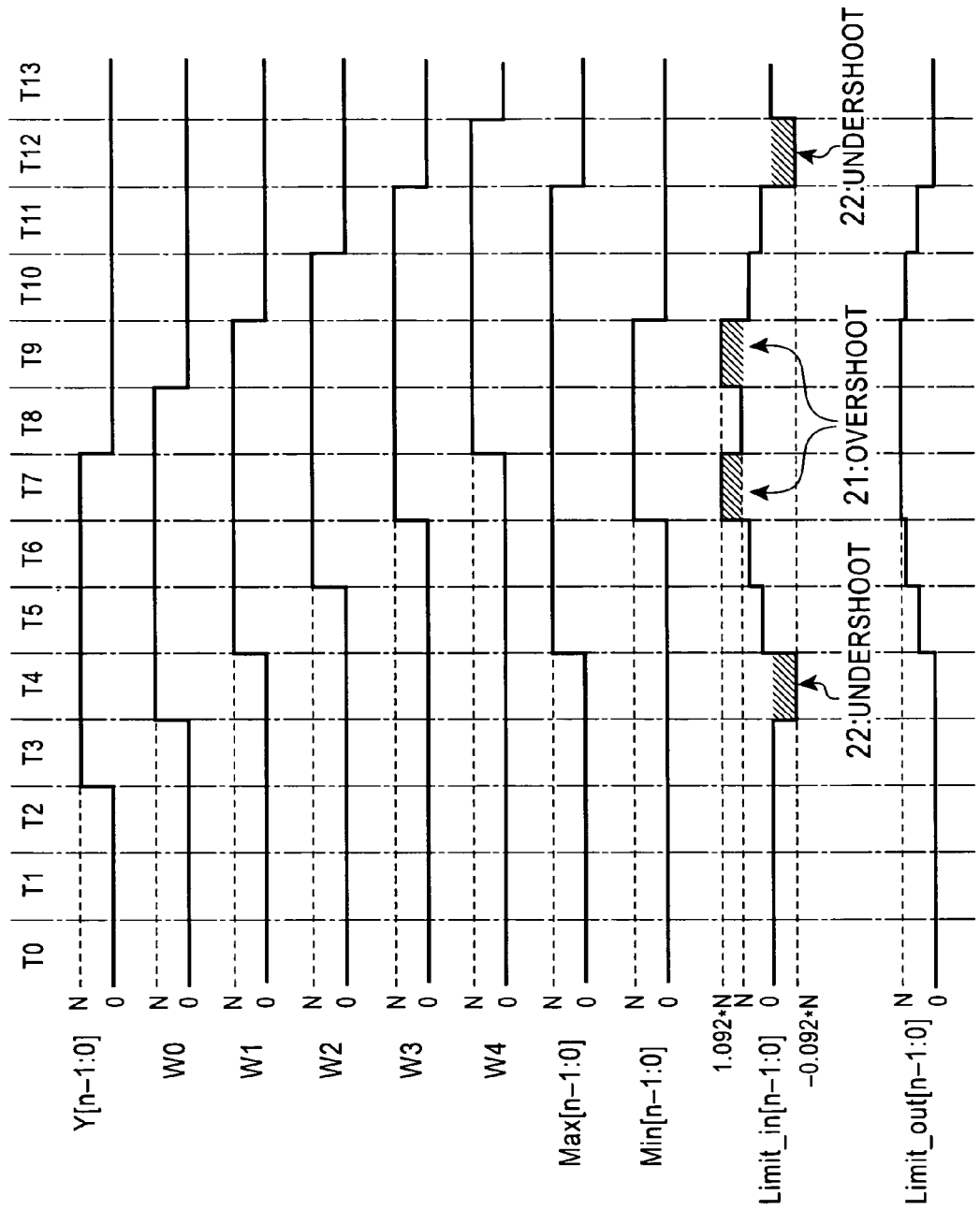
FIG. 8 is a waveform chart showing the relationship between internal latch data and input/output signals of the limiter circuit 50 in FIG. 1.
Figure 9:
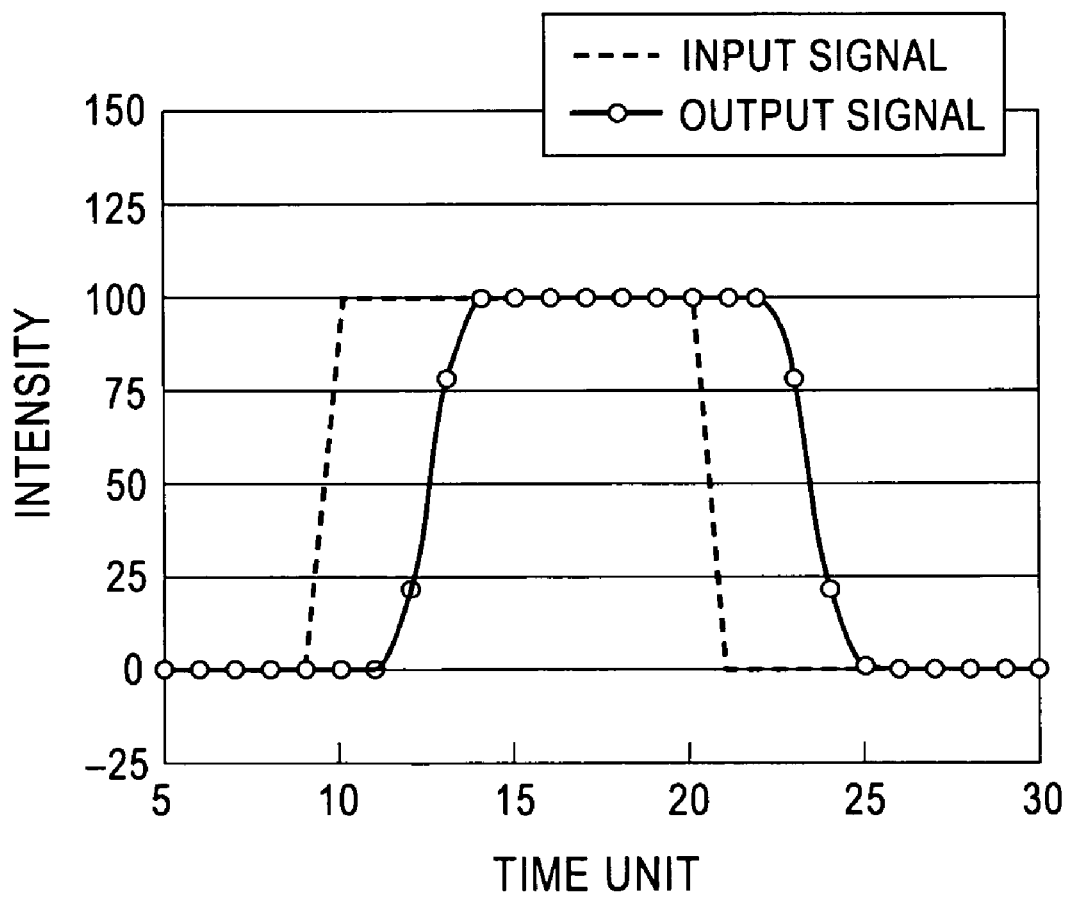
FIG. 9 is a waveform chart illustrating an input signal and an output signal in FIG. 1.

FIG. 8 is a waveform chart showing the relationship between the internal latch data w0[n−1:0] to w4[n−1:0] and the input/output signals Limit_in[n−1:0], Limit_out[n−1:0] of the limiter circuit 50, while FIG. 9 is a waveform chart showing an input signal Y[n−1:0] (broken line curve) and an output signal Limit_out[n−1:0] (solid line curve).

In time units T0 to T2, the input signal Y[n−1:0] has a value of "0," and the output signal Limit_in[n−1:0] of the filter 30 also has a value of "0." In time unit T4, the value of the input signal Y[n−1:0] is changed to N. In time unit 4, the output of the multiplier circuit 32-0 has a value of "−0.019*N." Since input signals w1[n−1:0] to w4[n−1:0] supplied to the remaining multiplier circuits 32-1 have a value of "0," the output has a value of "0." Therefore, the output signal Limit_in[n−1:0] of the filter 30 has a value of "−0.019*N" which is smaller than "0", thus causing the undershoot 22 to occur. The filter coefficients A(M) are calculated such that they are summed up to one, so that when the input signal w4[n−1:0] of the multiplier circuit 32-4 alone has a value of "0" in time unit T7, the output signal Limit_in[n−1:0] of the filter 30 has a value of "N*1.092" which is larger than N, thus causing the overshoot 21 to occur.

The value of the overshoot 21 is larger than the internal latch data w0[n−1:0] to w4[n−1:0], while the value of the undershoot 22 is smaller than the internal latch data w0[n−1:0] to w4[n−1:0]. This applies as well when the input signal Y[n−1:0] changes from N to zero. The first embodiment takes advantage of such a feature, such that the maximum/minimum detector circuit 40 detects the maximum value Max[n−1:0] and minimum value Min[n−1:0] from the internal latch data w1[n−1:0], w2[n−1:0], w3[n−1:0], and outputs the maximum value Max[n−1:0] and minimum value Min[n−1:0] to the limiter circuit 50.

The limiter circuit 50 uses the maximum value Max[n−1:0] and minimum value Min[n−1:0] detected by the maximum/minimum detector circuit 40 to compare with the output signal Limit_in[n−1:0] of the filter 30.

Specifically, in time unit T4 in FIG. 8, the undershoot 22 produced in the output signal Limit_in[n−1:0] of the filter 30 is smaller than the detected minimum value Min[n−1:0], so that the limiter circuit 50 selects the minimum value Min[n−1:0] for output as the signal Limit_out[n−1:0]. In time unit T7, the overshoot 21 produced in the output signal Limit_in[n−1:0] of the filter 30 is larger than the detected maximum value Max[n−1:0], so that the limiter circuit 50 selects the maximum value Max[n−1:0] for output as the signal Limit_out[n−1:0]. In the remaining time units T5, T6, T8, . . . , the output signal Limit_in[n−1:0] of the filter 30 is smaller than the detected maximum value Max[n−1:0] and larger than the detected minimum value Min[n−1:0], so that the limiter circuit 50 selects the output signal Limit_in[n−1:0] of the filter 30 for output as the signal Limit_out[n−1:0].

In this way, the overshoot 21 and undershoot 22 occurring in the filter 30 are eliminated as shown in FIG. 9.

Point Extraction Positions and Number of Points Required for Maximum/Minimum Detector Circuit 40

Figure 10:
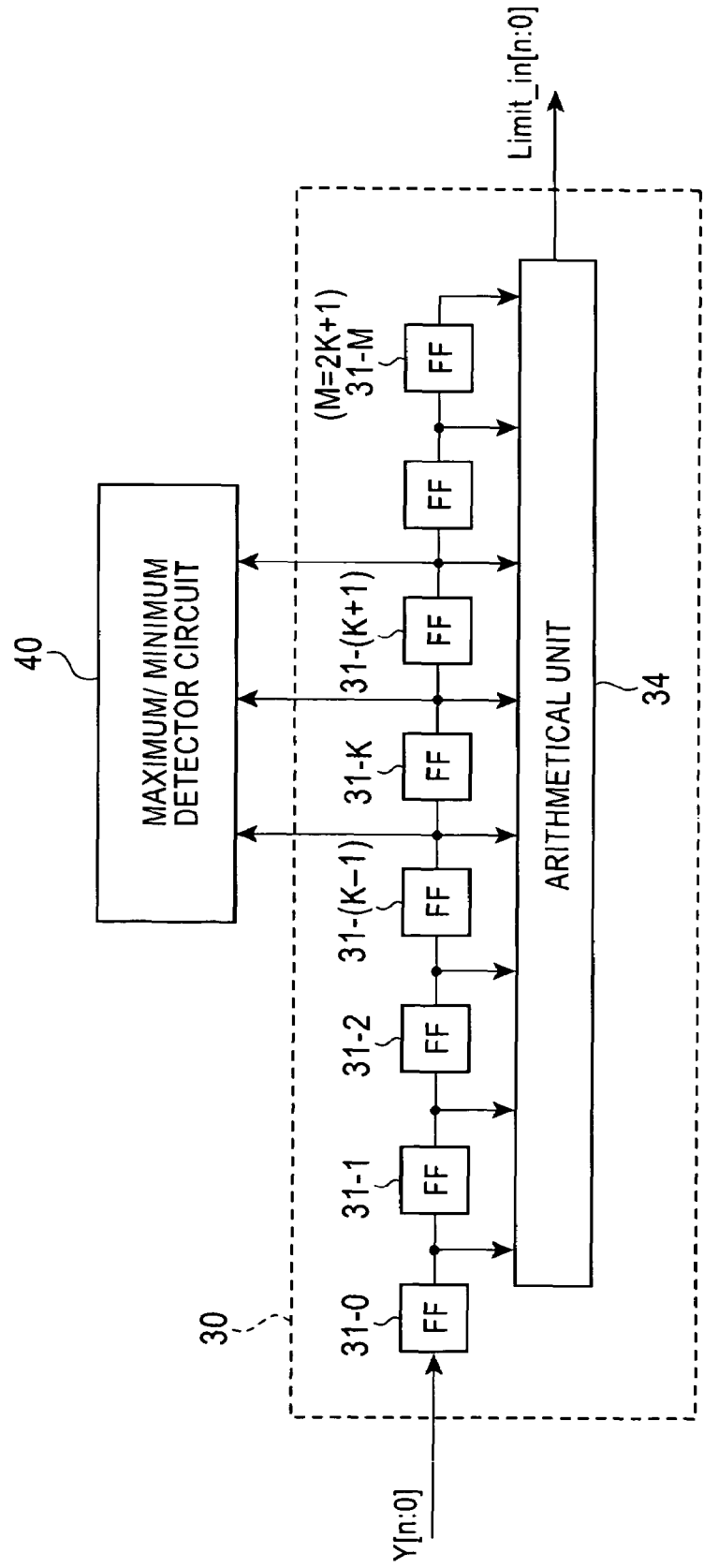
FIG. 10 is a schematic diagram illustrating an FIR digital filter 30 having n+1 taps in FIG. 1.
Figure 12A:
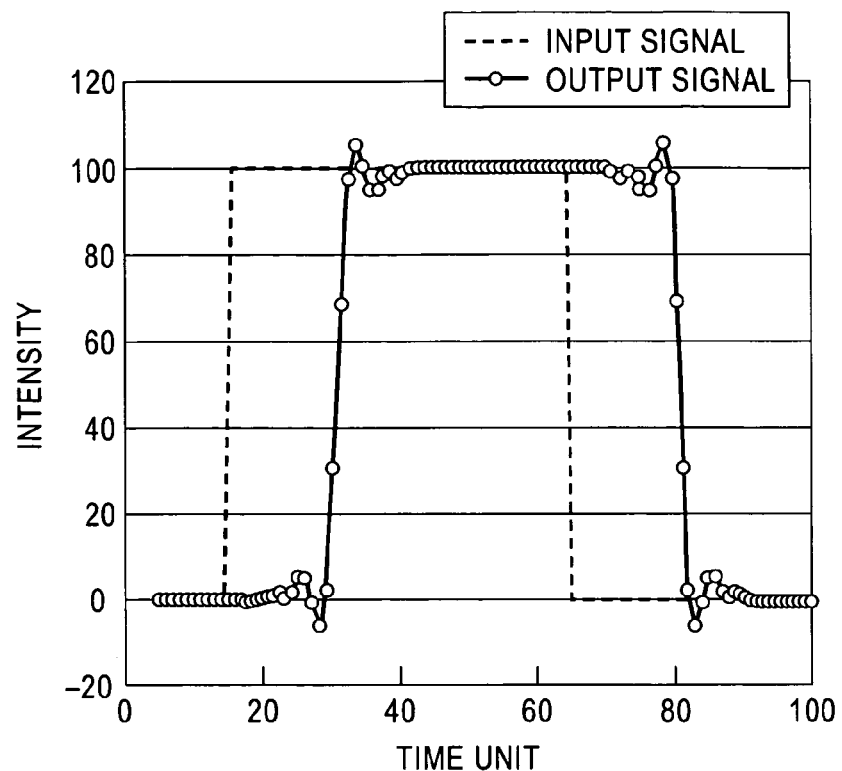
FIGS. 12A and 12B are diagrams illustrating a comparison of an output signal waveform between a conventional filter and the filter device according to the first embodiment when the number of the tap points is 31.
Figure 12B:
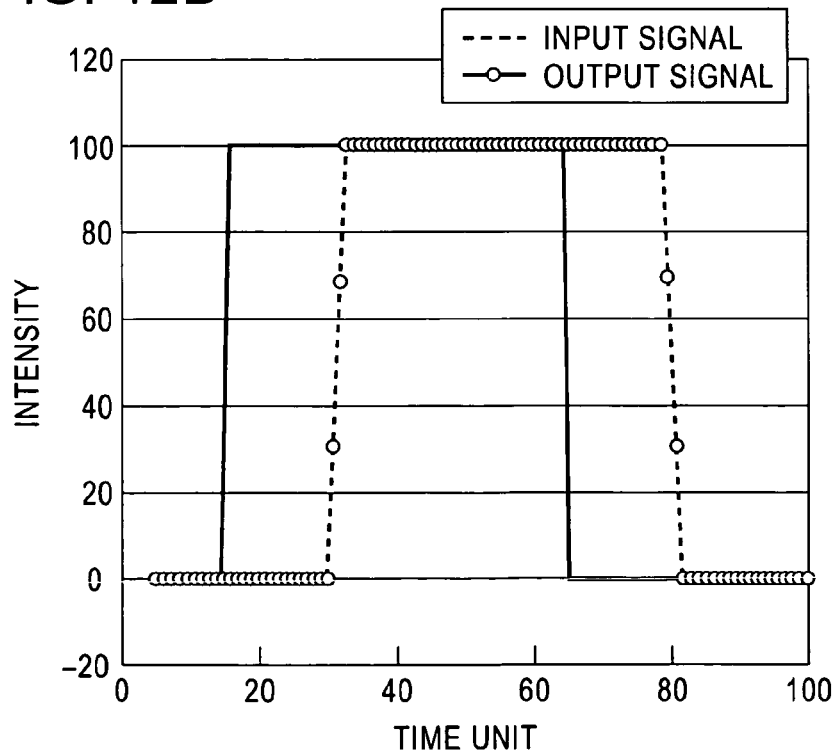

FIG. 10 is a schematic diagram of the FIR digital filter 30 which has M+1 (where M=2K+1) taps (i.e., symmetric processing coefficients centered at K) in FIG. 1. FIGS. 11A to 11D are input/output waveform charts of the FIR digital filter 30 in FIG. 10. FIGS. 12A and 12B are diagrams for showing a comparison of an output signal waveform of a conventional filter device with an output signal waveform of the filter device according to the first embodiment when the filter devices have 31 taps.

In the filter 30 of FIG. 10, a processing circuit 34, which receives output signals from FFs 31-0 to 31-M at M+1 stages, comprises M+1 multiplier circuits 32-0 to 32-n, and adder circuits 33-1 to 33-M having M stages. With the filter 30 having M+1 taps, point extraction positions connected to the maximum/minimum detector circuit 40 are the output of an FF 31-(K−1) at an {[M−1]/2−1}-th stage, the output of an FF 31-K at an [(M−1)/2]-th stage, and the output of an FF 31-(K+1) at an {[(M−1)/2]+1}-th stage. It can be seen from FIG. 12 that three points are sufficient irrespective of the number of taps M+1. The reason for this will be described below.

The filter 30 shown in FIG. 11 has a phase delay K. In other words, an input signal Y[n:0] is output after the phase K. FIGS. 11A, 11B, 11C, and 11D show a main input waveform and a filter output waveform after a time x. A signal which has passed the filter 30 presents a waveform which has noise attenuated in a high frequency region. When the input waveform is as shown in FIG. 11A, the filter output level of the signal after the time x from time t1 is lower than the level at time t1, but is not higher than the levels at times to, t2. When the input waveform is as shown in FIG. 11B, the filter output level of the signal after the time x from time t1 is between the signal levels at times to, t2. In FIGS. 1C, 1D, the filter output level of the signal after the time x from time t1 is between the maximum value and minimum value of the filter input levels at times t0, t1, t2.

As described above, in the FIR digital filter 30, the input signal Y[n:0] is output after the phase K (i.e., after the time x), and the input signal Y[n:0] is latched as an output signal of an FF 31-K after K stages. The FIR digital filter 30 is a filter having symmetric processing coefficients centered at K, and when the FIR digital filter 30 has M+1 taps, the relationship between K and M can be expressed by M=2K+1. In other words, point extraction points input to the maximum/minimum detector circuit 40 are outputs of FFs 31-(K−1), 31-K, and 31-(K+1) at {[(M−1)/2]-1}-th, [(M−1)/2]-th, and {[(M−1)/2]+1}-th stages when the filter 30 has M+1 taps.

(1) According to the foregoing embodiment, the maximum value Max[n−1:0] and minimum value Min[n−1:0] used by the limiter circuit 50 can be detected from internal latch data held in the filter 30, thereby completely removing the overshoot 21 and undershoot 22.

(2) Internal latch data input to the maximum/minimum detector circuit 40 may be taken at three points with suffice irrespective of the number of taps, so that the overshoot 21 and undershoot 22 can be exactly eliminated without making excessively complicated the circuit configuration of the maximum/minimum detector circuit 40 and limiter circuit 50.

Various modifications can be made to the present invention, not limited to the embodiment described above. Exemplary modifications may include, for example, the following (A) to (D).

(A) The FFs 31-0, . . . in FIG. 1 may be replaced with unit delay elements such as other circuit elements.

(B) The maximum/minimum detector circuit 40 in FIG. 6 may be composed of other logical circuits or the like.

(C) The limiter circuit 50 in FIG. 7 may be composed of other logical circuits or the like.

(D) The filter device in FIG. 1 may have a different number of taps for the filter 30 in accordance with the number of bits of the input signal Y.

The filter device of the present invention can be utilized as well in a variety of digital signal processing other than image signal processing.

It is understood that the foregoing description and accompanying drawings set forth the preferred embodiments of the present invention at the present time. Various modifications, additions and alternatives will, of course, become apparent to those skilled in the art in light of the foregoing teachings without departing from the sprit and scope of the disclosed invention. Thus, it should be appreciated that the invention is not limited to the disclosed embodiments but may be practiced within the full scope of the appended claims.

This application is based on Japanese Patent Application No. 2004-273998 which is hereby incorporated by reference.

What is claimed is:

1. A filter device comprising:
a digital filter including:
unit delay elements chained together and having M stages (where M is a positive integer equal to or larger than two) for shifting an n-bit (where n is a positive integer) digital input signal supplied thereto at the respective stages;
M multiplier circuits connected to the outputs of said unit delay elements at the respective stages, each for multiplying an output signal of said unit delay element at a stage associated therewith by a predetermined filter coefficient; and
adder circuits chained together and having (M−1) stages and connected to the outputs of said M multiplier circuits for summing output signals of said respective multiplier circuits to supply a filtered output signal;
a maximum/minimum detector circuit for receiving output signals from a plurality of said unit delay elements in different stages and for detecting a maximum value and a minimum value in the received output signals from said unit delay elements having M stages to supply a maximum value detection signal and a minimum value detection signal, said output signals received by said maximum/minimum detector circuit representing values of said input signal sampled at different times; and
a limiter circuit for receiving the filtered output signal supplied from said adder circuit at the (M−1)-th stage, limiting a maximum value of the filtered output signal based on the maximum value detection signal, limiting a minimum value of the filtered output signal based on the minimum value detection signal, and supplying the limited signal.

2. A filter device according to claim 1, wherein said unit delay elements each include a flip-flop.

3. A filter device according to claim 1, wherein M is at least 4, wherein the unit delay elements include a first unit delay element, a last unit delay element, and a plurality of intermediate unit delay elements disposed between the first and last delay elements, and wherein the plurality of unit delay elements from which the maximum/minimum detector circuit receives output signals are selected from among the intermediate unit delay units.

4. A filter device according to claim 3, wherein the maximum/minimum detector circuit receives output signals from three consecutive delay elements, the received output signals being the first, second, and third output signals.

5. A filter device according to claim 4, wherein said maximum/minimum detector circuit includes:
first comparing means for comparing values of the first, second, and third output signals;
first selecting means for selecting and supplying an output signal having a largest value from the first, second, and third output signals based on the result of the comparison made by said first comparing means;
second comparing means for comparing values of the first, second, and third output signals; and
second selecting means for selecting and supplying an output signal having a smallest value from the first, second, and third output signals based on the result of the comparison made by said second comparing means.

6. A filter device according to claim 1, wherein said maximum/minimum detector circuit receives output signals from less than all of said unit delay elements.

7. A filter device comprising:
a digital filter including:
unit delay elements chained together having (M+1) stages (where M is a positive integer equal to or larger than two) for shifting an (n+1)-bit (where n is a positive integer) digital input signal supplied thereto at the respective stages;
(M+1) multiplier circuits connected to the outputs of said unit delay elements at the respective stages, each for multiplying an output signal of said unit delay element at a stage associated therewith by a predetermined filter coefficient; and
adder circuits chained together M stages and connected to the outputs of said (M+1) multiplier circuits for summing output signals of said respective multiplier circuits to supply a filtered output signal;
a maximum/minimum detector circuit for detecting a maximum value and a minimum value in a first output signal of one of said unit delay element at a K-th (where K is a positive integer not exceeding M−1) stage, a second output signal of another of said unit delay elements at a (K+1)-th stage, and a third output signal of a further one of said unit delay elements at a (K+2)-th stage to supply a maximum value detection signal and a minimum value detection signal, said first, second, and third output signals representing values of said input signal sampled at different times; and
a limiter circuit for receiving the filtered output signal supplied from said adder circuit at the M-th stage, limiting a maximum value of the filtered output signal based on the maximum value detection signal, limiting a minimum value of the filtered output signal based on the minimum value detection signal, and supplying the limited signal.

8. A filter device according to claim 3, wherein said unit delay elements each include a flip-flop.

9. A filter device according to claim 3, wherein said maximum/minimum detector circuit includes:
first comparing means for comparing values of the first, second, and third output signals;
first selecting means for selecting and supplying an output signal having a largest value from the first, second, and third output signals based on the result of the comparison made by said first comparing means;
second comparing means for comparing values of the first, second, and third output signals; and
second selecting means for selecting and supplying an output signal having a smallest value from the first, second, and third output signals based on the result of the comparison made by said second comparing means.

10. A filter device according to claim 7, wherein (M+1)>3 and said maximum/minimum detector circuit detects maximum and minimum values of said output signals of said unit delay elements at only said K-th, (K+1)-th, and (K+2)-th stages.

11. A filter device comprising:
a digital filter that receives samples of an input signal and outputs samples of a filtered signal, the digital filter including a sequence of delay stages that output samples received by the digital filter, the sequence of delay stages including a first delay stage, a last delay stage, and a plurality of intermediate delay stages;
a maximum/minimum detector that receives samples output by at least some of the intermediate delay stages and selects a maximum sample and a minimum sample from among the samples output by the at least some of the intermediate delay stages, the samples received by the maximum/minimum detector representing samples received by the digital filter at different times; and a limiter that receives the samples of the filtered signal that are output by the digital filter and limits them so that they do not exceed the maximum sample in magnitude or fall below the minimum sample in magnitude.

12. A filter device according to claim 11, wherein not all of the intermediate delay stages are included in the at least some of the intermediate delay stages.

13. A filter device according to claim 11, wherein the at least some of the intermediate delay stages are three consecutive stages.

14. A filter device according to claim 11, wherein said maximum/minimum detector circuit receives samples output by three intermediate stages.

* * * * *